United States Patent
Lyalin et al.

(10) Patent No.: US 10,110,183 B2
(45) Date of Patent: Oct. 23, 2018

(54) POWER AMPLIFICATION SYSTEM WITH COMMON BASE PRE-AMPLIFIER

(71) Applicant: SKYWORKS SOLUTIONS, INC., Woburn, MA (US)

(72) Inventors: Aleksey A. Lyalin, Moorpark, CA (US); Taesong Hwang, Thousand Oaks, CA (US); Russ Alan Reisner, Oxnard, CA (US)

(73) Assignee: Skyworks Solutions, Inc., Woburn, MA (US)

( * ) Notice: Subject to any disclaimer, the term of this patent is extended or adjusted under 35 U.S.C. 154(b) by 60 days.

(21) Appl. No.: 15/042,355

(22) Filed: Feb. 12, 2016

(65) Prior Publication Data
US 2016/0241295 A1    Aug. 18, 2016

Related U.S. Application Data

(60) Provisional application No. 62/116,460, filed on Feb. 15, 2015.

(51) Int. Cl.
| | |
|---|---|
| *H03F 3/24* | (2006.01) |
| *H03F 1/02* | (2006.01) |
| *H03F 3/195* | (2006.01) |
| *H03F 3/21* | (2006.01) |
| *H03F 1/22* | (2006.01) |
| *H03F 1/56* | (2006.01) |
| *H03F 3/72* | (2006.01) |
| *H04B 1/04* | (2006.01) |

(52) U.S. Cl.
CPC ........... *H03F 3/245* (2013.01); *H03F 1/0288* (2013.01); *H03F 1/22* (2013.01); *H03F 1/565* (2013.01); *H03F 3/195* (2013.01); *H03F 3/211* (2013.01); *H03F 3/72* (2013.01); *H03F 2200/111* (2013.01); *H03F 2200/225* (2013.01); *H03F 2200/451* (2013.01); *H03F 2200/72* (2013.01); *H03F 2203/21127* (2013.01); *H03F 2203/7209* (2013.01); *H04B 2001/0416* (2013.01)

(58) Field of Classification Search
CPC .................................. H03F 3/2176; H03F 1/22
USPC .................................................... 330/310, 311
See application file for complete search history.

(56) References Cited

U.S. PATENT DOCUMENTS

| | | | | |
|---|---|---|---|---|
| 4,677,392 A | * | 6/1987 | Yang | G01S 7/4021 330/284 |
| 6,621,341 B1 | * | 9/2003 | Shifrin | H03F 3/3435 330/110 |
| 7,714,662 B2 | * | 5/2010 | Jeong | H03F 1/223 330/126 |
| 9,300,351 B2 | * | 3/2016 | Sharma | H04W 52/0229 |
| 9,373,613 B2 | * | 6/2016 | Quaglietta | H01L 27/0248 |

* cited by examiner

*Primary Examiner* — Henry Choe
(74) *Attorney, Agent, or Firm* — Chang & Hale LLP (57) ABSTRACT

Power amplification system with common base pre-amplifier. A power amplification system can include a common base amplifier configured to amplify an input radio-frequency (RF) signal received at an input node to generate an intermediate RF signal at an intermediate node. The power amplification system can further include a power amplifier configured to amplify the intermediate RF signal received at the intermediate node to generate an output RF signal at an output node.

17 Claims, 7 Drawing Sheets

FIG.10

POWER AMPLIFICATION SYSTEM WITH COMMON BASE PRE-AMPLIFIER

CROSS-REFERENCE TO RELATED APPLICATION(S)

This application claims priority to U.S. Provisional Application No. 62/116,460 filed Feb. 15, 2015, entitled PRE-DRIVER FOR HIGH-VOLTAGE POWER AMPLIFIER, the disclosure of which is hereby expressly incorporated by reference herein in its entirety.

BACKGROUND

Field

The present disclosure generally relates to power amplifications systems.

Description of the Related Art

A power amplification system can include multiple stages to achieve a specified gain. In some applications, the multiple stages can require impedance matching between the stages or can drive the gain to potentially unstable levels.

SUMMARY

In accordance with some implementations, the present disclosure relates to a power amplification system. The power amplification system includes a common base amplifier configured to amplify an input radio-frequency (RF) signal received at an input node to generate an intermediate RF signal at an intermediate node. The power amplification system further includes a power amplifier configured to amplify the intermediate RF signal received at the intermediate node to generate an output RF signal at an output node.

In some embodiments, the common base amplifier can include a transistor having an emitter coupled to the input node, a collector coupled to the intermediate node, and a base coupled to a ground potential. In some embodiments, the collector can be coupled to the intermediate node via an impedance. In some embodiments, the impedance can include a capacitor coupled between the collector and the intermediate node and an inductor coupled between the collector and a supply voltage. In some embodiments, the base can be coupled to the ground potential via an impedance. In some embodiments, the impedance can include a capacitor coupled between the base and the ground potential and a resistor coupled between the base and a battery voltage.

In some embodiments, the common base amplifier can be configured to amplify the input RF signal by approximately 3 to 5 dB. In some embodiments, the common base amplifier can present an input impedance of approximately 50 ohms.

In some embodiments, the power amplifier can be a single-ended power amplifier. In some embodiments, the single-ended power amplifier can include a cascode power amplifier.

In some embodiments, the power amplifier can be one of a carrier amplifier or a peaking amplifier of a Doherty power amplifier. In some embodiments, the common base amplifier can include a transistor having an emitter coupled to the input node, a base coupled to a battery voltage via a resistor, and an emitter coupled to the battery voltage via an inductor. In some embodiments, the base can be further coupled to a ground potential via a first capacitor and the emitter can be further coupled to the intermediate node via a second capacitor.

In some embodiments, the power amplifier is a high-voltage power amplifier. In some embodiments, the high-voltage power amplifier is a high-voltage bipolar transistor power amplifier.

In some implementations, the present disclosure relates to a radio-frequency (RF) module including a packaging substrate configured to receive a plurality of components. The RF module includes a power amplification system implemented on the packaging substrate. The power amplification system includes a common base amplifier configured to amplify an input radio-frequency (RF) signal received at an input node to generate an intermediate RF signal at an intermediate node and a power amplifier configured to amplify the intermediate RF signal received at the intermediate node to generate an output RF signal at an output node.

In some embodiments, the RF module can be a front-end module (FEM).

In some embodiments, the RF module can further include further a voltage supply system implemented on the packaging substrate. The voltage supply system can be configured to supply a voltage to at least one of the common base amplifier or the power amplifier.

In some implementations, the present disclosure relates to a wireless device including a transceiver configured to generate an input radio-frequency (RF) signal. The wireless device includes a front-end module (FEM) in communication with the transceiver. The FEM includes a packaging substrate configured to receive a plurality of components. The FEM further includes a power amplification system implemented on the packaging substrate. The power amplification system includes a common base amplifier configured to amplify at least a portion of the input radio-frequency (RF) signal received at an input node to generate an intermediate RF signal at an intermediate node and a power amplifier configured to amplify the intermediate RF signal received at the intermediate node to generate an output RF signal at an output node. The wireless device further includes an antenna in communication with the FEM. The antenna is configured to transmit the output RF signal.

For purposes of summarizing the disclosure, certain aspects, advantages and novel features of the inventions have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

DETAILED DESCRIPTION OF SOME EMBODIMENTS

The headings provided herein, if any, are for convenience only and do not necessarily affect the scope or meaning of the claimed invention.

Described herein are circuits and systems including a common base (CB) amplifier as a driver (or pre-amplifier) for high voltage bipolar transistor amplifiers (e.g., as used in 3G or 4G handset applications). By utilizing a common base amplifier, a moderate include of 3 to 5 dB in overall amplifier gain can be achieved for the minimal cost of a few components added.

A common base amplifier can provide advantages over common emitter (CE) amplifiers in that the common base amplifier can be naturally matched to a 50 ohm input impedance without a separate input matching circuit and without pushing overall gain to potentially unstable levels.

Figure 1:
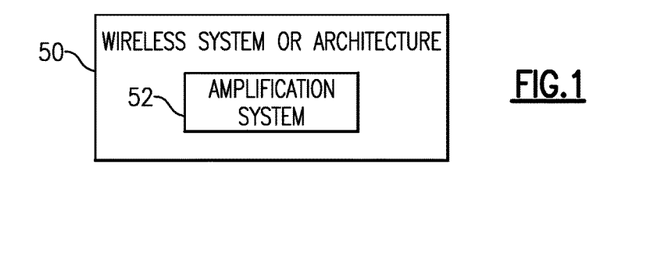
FIG. 1 shows an example wireless system or architecture.

Referring to FIG. 1, one or more features of the present disclosure generally relate to a wireless system or architecture 50 having an amplification system 52. In some embodiments, the amplification system 52 can be implemented as one or more devices, and such device(s) can be utilized in the wireless system/architecture 50. In some embodiments, the wireless system/architecture 50 can be implemented in, for example, a portable wireless device. Examples of such a wireless device are described herein.

Figure 2:
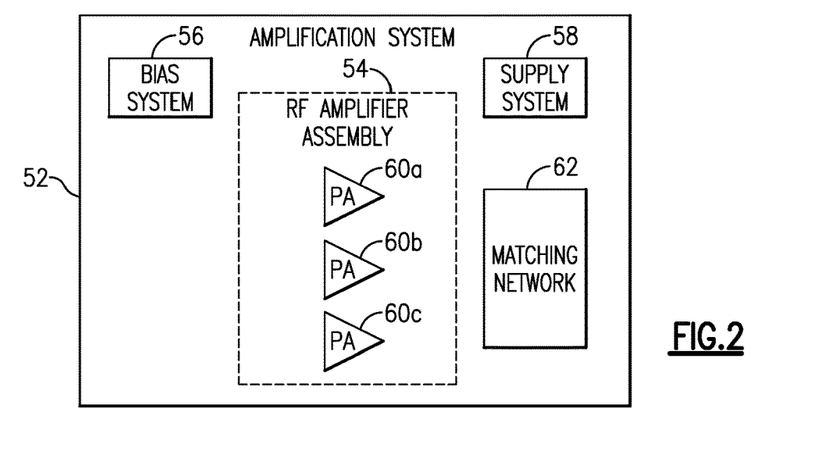
FIG. 2 shows that, in some implementations, an amplification system can include a radio-frequency (RF) amplifier assembly having one or more power amplifiers.

FIG. 2 shows that the amplification system 52 of FIG. 1 typically includes a radio-frequency (RF) amplifier assembly 54 having one or more power amplifiers (PAs). In the example of FIG. 2, three PAs 60a-60c are depicted as forming the RF amplifier assembly 54. It will be understood that other numbers of PA(s) can also be implemented. It will also be understood that one or more features of the present disclosure can also be implemented in RF amplifier assemblies having other types of RF amplifiers.

In some embodiments, the RF amplifier assembly 54 can be implemented on one or more semiconductor die, and such die can be included in a packaged module such as a power amplifier module (PAM) or a front-end module (FEM). Such a packaged module is typically mounted on a circuit board associated with, for example, a portable wireless device.

The PAs (e.g., 60a-60c) in the amplification system 52 are typically biased by a bias system 56. Further, supply voltages for the PAs are typically provided by a supply system 58. In some embodiments, either or both of the bias system 56 and the supply system 58 can be included in the foregoing packaged module having the RF amplifier assembly 54.

In some embodiments, the amplification system 52 can include a matching network 62. Such a matching network can be configured to provide input matching and/or output matching functionalities for the RF amplifier assembly 54.

Figure 3A:
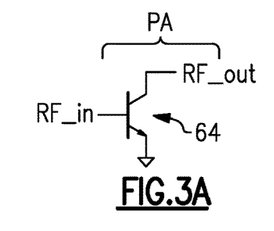
FIGS. 3A-3E show non-limiting examples of power amplifiers.

For the purpose of description, it will be understood that each PA (60) of FIG. 2 can be implemented in a number of ways. FIGS. 3A-3E show non-limiting examples of how such a PA can be configured. FIG. 3A shows an example PA having an amplifying transistor 64, where an input RF signal (RF_in) is provided to a base of the transistor 64, and an amplified RF signal (RF_out) is output through a collector of the transistor 64.

Figure 3B:
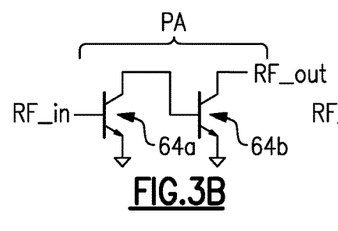

FIG. 3B shows an example PA having a plurality of amplifying transistors (e.g., 64a, 64b) arranged in stages. An input RF signal (RF_in) is provided to a base of the first transistor 64a, and an amplified RF signal from the first transistor 64a is output through its collector. The amplified RF signal from the first transistor 64a is provided to a base of the second transistor 64b, and an amplified RF signal from the second transistor 64b is output through its collector to thereby yield an output RF signal (RF_out) of the PA.

Figure 3C:
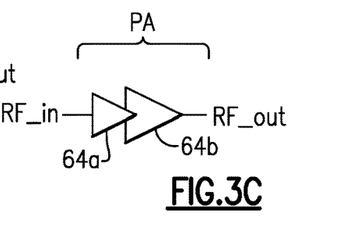

In some embodiments, the foregoing example PA configuration of FIG. 3B can be depicted as two or more stages as shown in FIG. 3C. The first stage 64a can be configured as, for example, a driver stage; and the second stage 64b can be configured as, for example, an output stage.

Figure 3D:
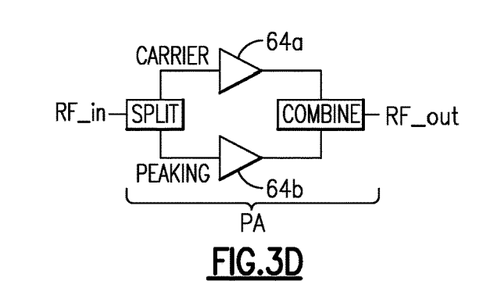

FIG. 3D shows that in some embodiments, a PA can be configured as a Doherty PA. Such a Doherty PA can include amplifying transistors 64a, 64b configured to provide carrier amplification and peaking amplification of an input RF signal (RF_in) to yield an amplified output RF signal (RF_out). The input RF signal can be split into the carrier portion and the peaking portion by a splitter. The amplified carrier and peaking signals can be combined to yield the output RF signal by a combiner.

Figure 3E:
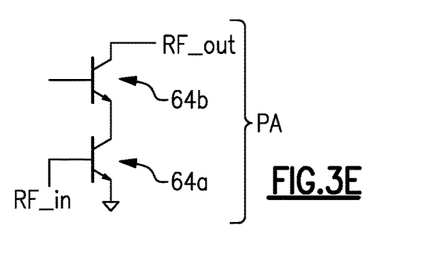

FIG. 3E shows that in some embodiments, a PA can be implemented in a cascode configuration. An input RF signal (RF_in) can be provided to a base of the first amplifying transistor 64a operated as a common emitter device. The output of the first amplifying transistor 64a can be provided through its collector and be provided to an emitter of the second amplifying transistor 64b operated as a common base device. The output of the second amplifying transistor 64b can be provided through its collector so as to yield an amplified output RF signal (RF_out) of the PA.

In the various examples of FIGS. 3A-3E, the amplifying transistors are described as bipolar junction transistors (BJTs) such as heterojunction bipolar transistors (HBTs). It will be understood that one or more features of the present disclosure can also be implemented in or with other types of transistors such as field-effect transistors (FETs).

Figure 4:
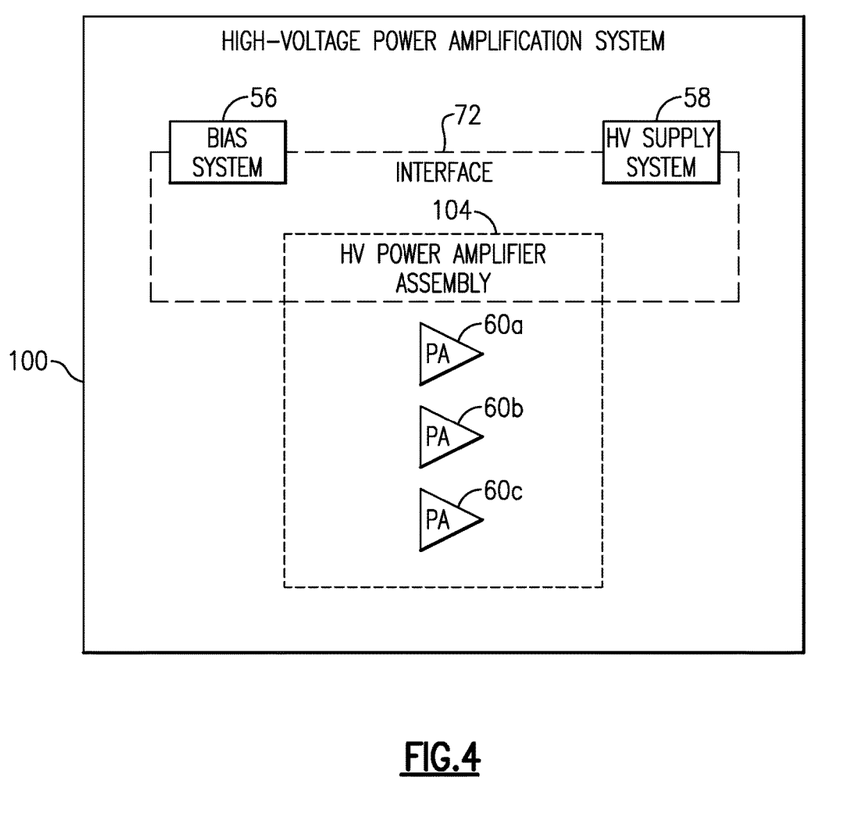
FIG. 4 shows that, in some implementations, an amplification system can be implemented as a high-voltage (HV) power amplification system.

FIG. 4 shows that in some embodiments, the amplification system 52 of FIG. 2 can be implemented as a high-voltage (HV) power amplification system 70. Such a system can include an HV power amplifier assembly 54 configured to include HV amplification operation of some or all of the PAs (e.g., 60a-60c). As described herein, such PAs can be biased by a bias system 56. In some embodiments, the foregoing HV amplification operation can be facilitated by an HV supply system 58. In some embodiments, an interface system 72 can be implemented to provide interface functionalities between the HV power amplifier assembly 54 and either or both of the bias system 56 and the HV supply system 58.

Figure 5:
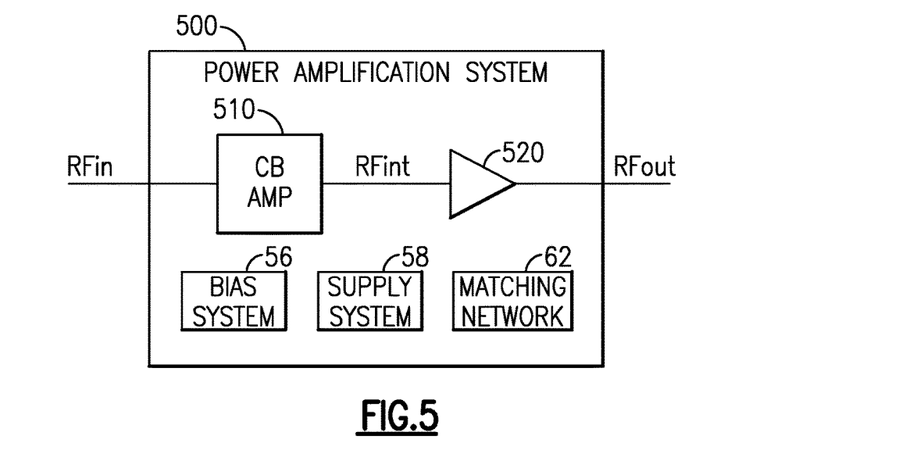
FIG. 5 shows that in some embodiments, a power amplification system can include a common base amplifier disposed as a pre-amplifier.

FIG. 5 shows that in some embodiments, a power amplification system 500 can include a common base amplifier 510 disposed as a pre-amplifier. The power amplification system 500 includes a common base amplifier 510 configured to amplify an input radio-frequency (RF) signal (RFin) received at an input node to generate an intermediate RF signal (RFint) at an intermediate node. The power amplification system further includes a power amplifier 520 configured to amplify the intermediate RF signal to generate an output RF signal (RFout) at an output node.

Like the amplification system 52 of FIG. 1, the power amplification system 500 of FIG. 5 includes a bias system 56 configured to provide a bias voltage to one or more transistors of the power amplification system 500, a supply system 58 configured to provide a supply voltage to at least one of the common base amplifier 510 or the power amplifier 520, and a matching network 62 configured to provide input matching, intermediate matching (between the common base amplifier 510 and the power amplifier 520), and/or output matching functionalities for the power amplification system 500.

In some implementations, the common base amplifier is configured to amplify the input RF signal by approximately 3 to 5 dB. Further, in some implementations, the common base amplifier presents in input impedance of approximately 50 ohms without an input matching component (e.g., the matching network 62 does not include an input matching component).

The power amplifier 520 can be any of the power amplifiers described above with respect to FIGS. 3A-3E or any other type of power amplifier. In particular, in some embodiments, the power amplifier 520 is a single-ended power amplifier. In some embodiments, the power amplifier 520 is a cascode power amplifier. In some embodiments, the power amplifier 520 is one of a carrier amplifier or a peaking amplifier. In such embodiments, the power amplification system 500 can include an additional common base amplifier disposed as a pre-amplifier for the other of the carrier amplifier or the peaking amplifier.

In some implementations, the power amplifier 520 is a high-voltage power amplifier. In particular, in some implementations, the power amplifier 520 is a high-voltage bipolar transistor power amplifier.

Figure 6:
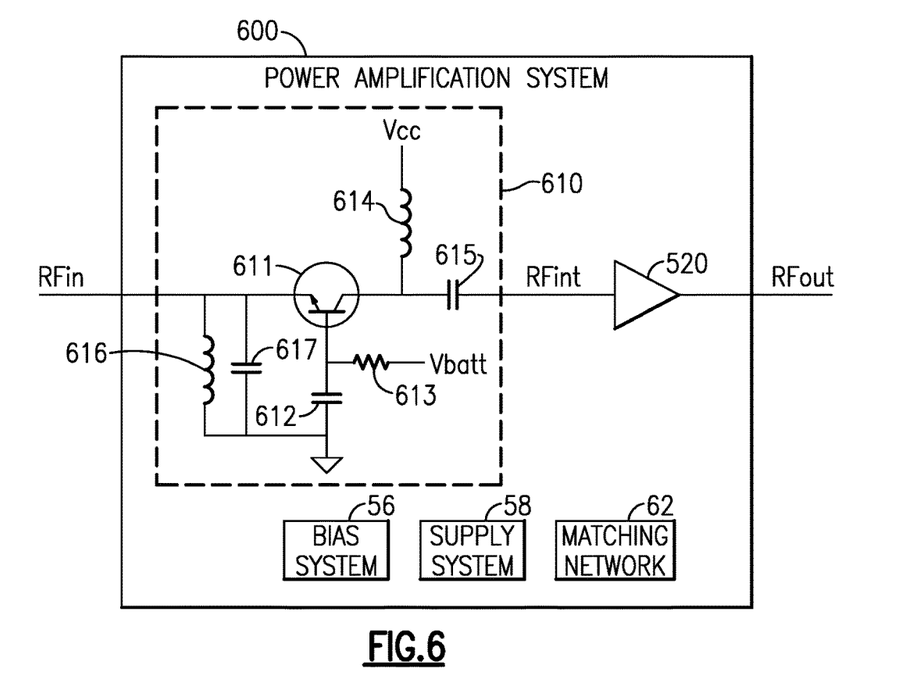
FIG. 6 shows that in some implementations, a common base amplifier can include a transistor.

FIG. 6 shows that in some implementations, a common base amplifier 610 can include a transistor 611. The power amplification system 600 is a specific example of the power amplification system 500 of FIG. 5 and includes a common base amplifier 610 disposed as a pre-amplifier for a power amplifier 520. In particular the common base amplifier 610 is configured to amplify an input radio-frequency (RF) signal (RFin) received at an input node to generate an intermediate RF signal (RFint) at an intermediate node. The power amplifier 520 is configured to amplify the intermediate RF signal to generate an output RF signal (RFout) at an output node.

Like the power amplification system 500 of FIG. 5, the power amplification system 600 includes a bias system 56, a supply system 58, and a matching network 62.

The common base amplifier 610 includes a transistor 611 having an emitter coupled to the input node, a collector coupled to the intermediate node, and a base coupled to a ground potential. The collector of the transistor 611 is coupled to the intermediate node via an impedance including first capacitor 615 coupled between the collector and the intermediate node and an inductor 614 coupled between the collector and a supply voltage. The supply voltage can be provided, for example, by the supply system 58. The base of the transistor 611 is coupled to the ground potential via an impedance including a second capacitor 612 coupled between the base and the ground potential and a resistor 613 coupled between the base and a battery voltage. The battery voltage can be provided, for example, by a battery or the supply system 58.

The common base amplifier 610 further includes an LC tank circuit (which may be tuned to appear as an open circuit for a transmission frequency) that includes an inductor 616 coupled between the emitter of the transistor 611 and the ground potential and a capacitor 617 coupled between the emitter of the transistor 611 and the ground potential.

Figure 7:
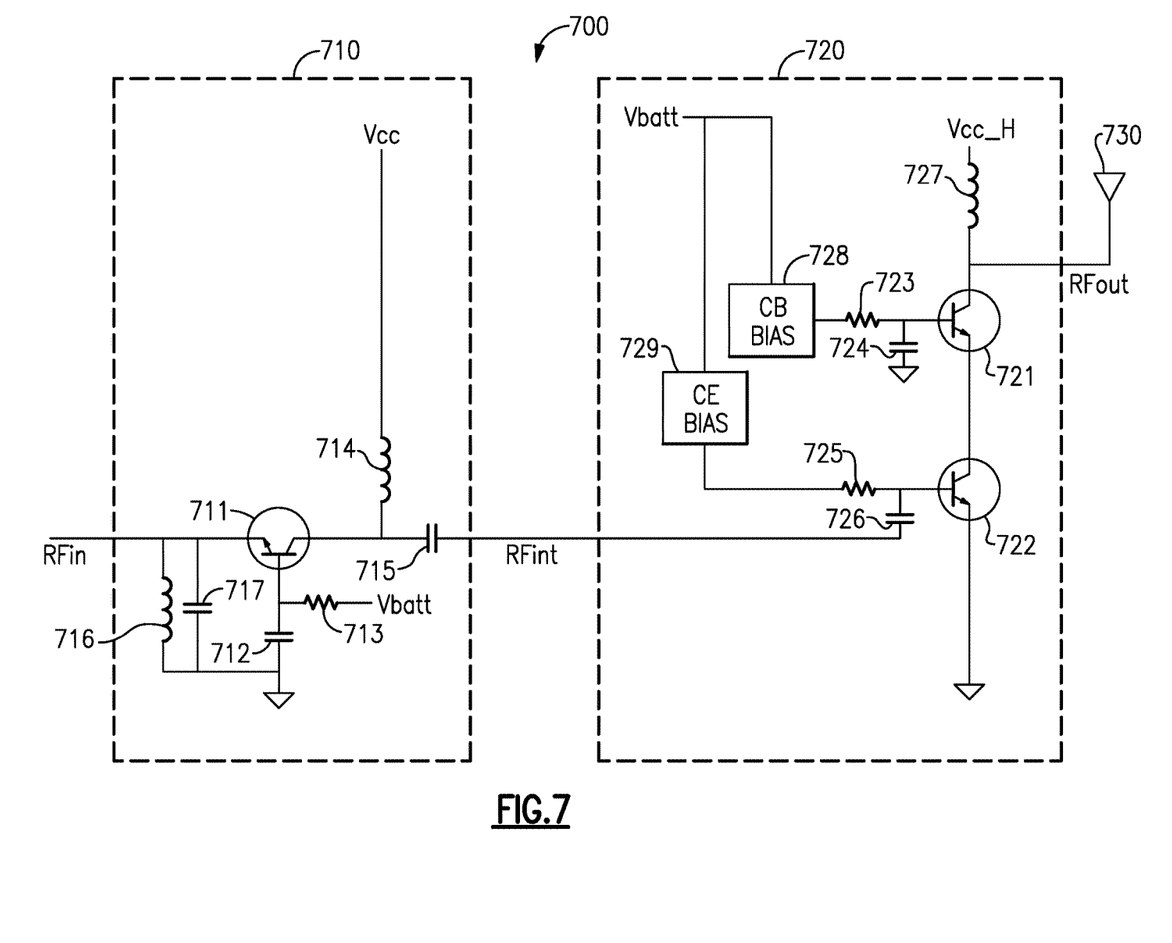
FIG. 7 shows that in some embodiments, a power amplification system can include a common base amplifier and a cascode amplifier.

FIG. 7 shows that in some embodiments, a power amplification system 700 can include a common base amplifier 710 and a cascode amplifier 720. When a cascode HBT (heterojunction bipolar transistor) amplifier is used at commercial mobile phone frequency bands, most of the specified gain can be achieved in a one-stage power amplifier. However, using HBT transistors with a cutoff frequency of approximately 45 GHz can result in gain falling below a 27 to 30 dB target in the 1.8 to 2.7 GHz range. Adding a common emitter pre-driver can lead to excessive gain well over 30 dB, potentially causing instability of the amplifier chain. Further, small common emitter amplifier stages without feedback can be difficult to match to a system impedance of 50 ohms. Adding feedback can have a negative input on power added efficiency.

The common base amplifier 710 is configured to amplify an input radio-frequency (RF) signal (RFin) received at an input node to generate an intermediate RF signal (RFint) at an intermediate node. The power amplifier 720 is configured to amplify the intermediate RF signal to generate an output RF signal (RFout) at an output node.

The common base amplifier 710 includes a transistor 711 having an emitter coupled to the input node, a collector coupled to the intermediate node, and a base coupled to a ground potential. The collector of the transistor 711 is coupled to the intermediate node via an impedance including first capacitor 715 coupled between the collector and the intermediate node and an inductor 714 coupled between the collector and a supply voltage (Vcc). The base of the transistor 711 is coupled to the ground potential via an impedance including a second capacitor 712 coupled between the base and the ground potential and a resistor 713 coupled between the base and a battery voltage.

The common base amplifier 710 further includes an LC tank circuit (which may be tuned to appear as an open circuit for a transmission frequency) that includes an inductor 716 coupled between the emitter of the transistor 711 and the ground potential and a capacitor 717 coupled between the emitter of the transistor 711 and the ground potential.

The common base amplifier 710 can be biased to 0.5 to 1.0 mA of emitter current, resulting in an input impedance of approximately 50 ohms at room temperature that naturally matches a system impedance. When used at moderate power levels, the input impedance remains at approximately 50 ohms over a wide range of frequencies and does not require an additional input matching circuit.

The cascode amplifier 720 can have an input impedance between approximately 80 and 150 ohms, resulting in a moderate voltage (and power) gain of approximately 3 dB (or between 3 and 5 dB). Thus, the overall gain of the power amplification system 700 can be approximately 30 dB without jeopardizing amplifier stability. Further, the slight gain caused by the common base amplifier 710 partially linearizes the AM-AM (amplitude modulation to amplitude modulation) characteristic of the cascode amplifier 720.

The cascode amplifier 720 includes a common emitter stage and a common base stage. The common emitter stage includes a first transistor 722 having an emitter coupled to a ground potential. The common base stage includes a second transistor 721 having a base coupled, via a capacitor 724, to the ground potential. The first transistor 722 includes a base coupled, via a capacitor 726, to the intermediate node. The first transistor 722 also has a collector coupled to an emitter of the second transistor 721.

The second transistor 721 has a collector coupled, via an inductor 727, to a supply voltage (Vcc_H). The supply voltage provided to the cascode amplifier 720 can be the same supply voltage provided to the common base amplifier 710 or a different supply voltage. In some implementations, the supply voltage provided to the cascode amplifier 720 is higher than the supply voltage provided to the common base amplifier 710. In particular, in some implementations, the cascode amplifier 720 is a high-voltage power amplifier whereas the common base amplifier 710 is not a high-voltage power amplifier. For example, the supply voltage provided to the cascode amplifier 720 can be approximately 10 V whereas the supply voltage provided to the common base amplifier 710 can be approximately 3.4 V. The collector of the second transistor 721 is also coupled to the output node and an antenna 730 for transmitting the output RF signal.

The cascode amplifier 720 further includes a biasing circuit for biasing the first transistor 722 and the second transistor 721. The biasing circuit includes a common emitter biasing component 729 that is coupled to the base of the first transistor 722 via an RC decoupling component. The RC decoupling component includes a resistor 725 coupled between the common emitter biasing component 729 and the base of the first transistor 722 and further includes a capacitor 726 coupled between the intermediate node and the base of the first transistor 722.

The biasing circuit further includes a common base biasing component 728 coupled to the base of the second transistor 721 via an RC decoupling component. The RC decoupling component includes a resistor 723 coupled between the common base biasing component 728 and the base of the second transistor 721 and further includes a capacitor 724 coupled between the ground potential and the base of the second transistor 721.

The common emitter biasing component 729 is configured to, when enabled, use a battery voltage (Vbatt) to provide a biasing signal to the first transistor 722. The biasing signal may be a biasing current or a biasing voltage. Similarly, the common base biasing component 728 is configured to, when enabled, use the battery voltage (Vbatt) to provide a biasing signal to the second transistor 721.

Figure 8:
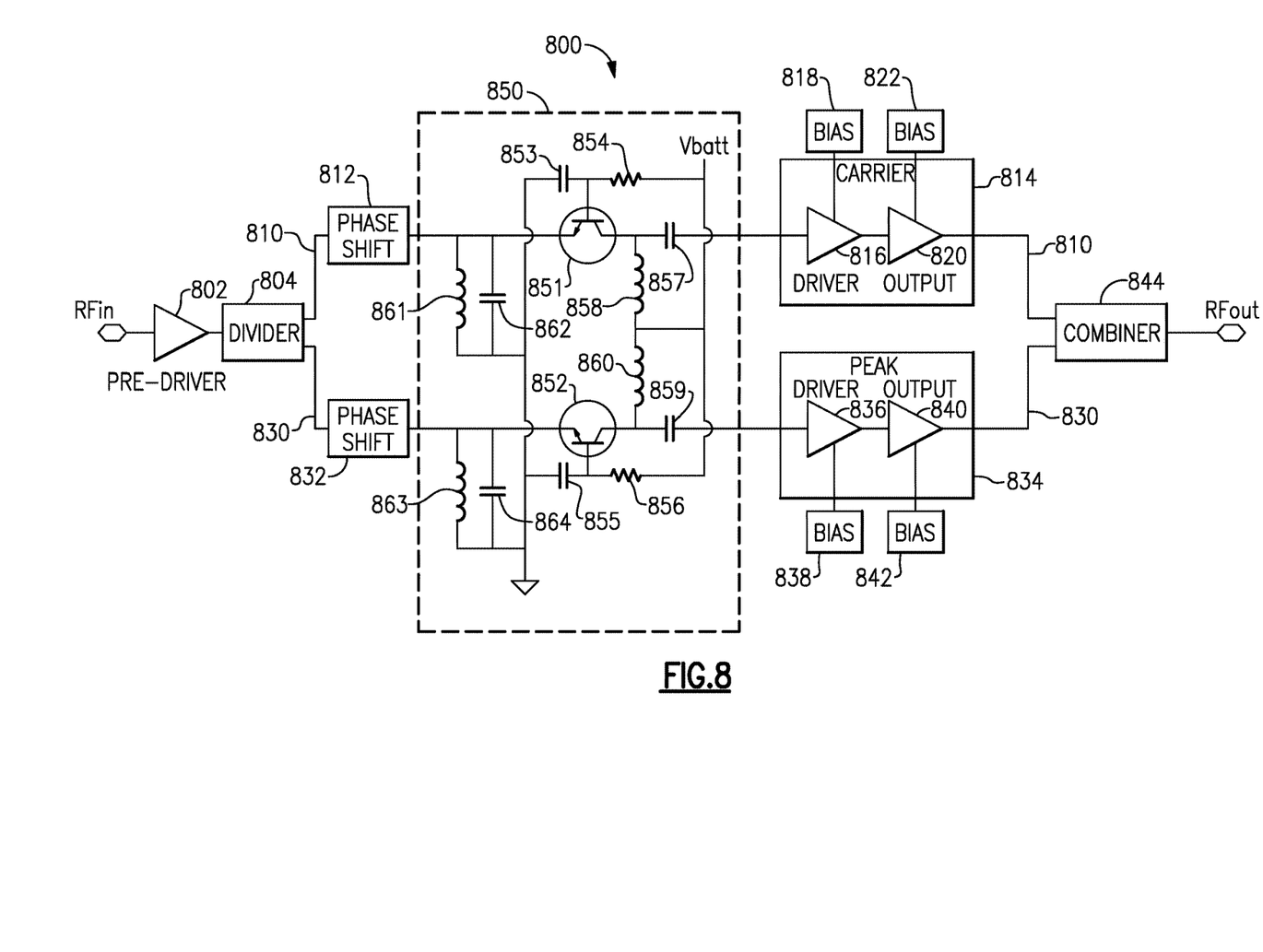
FIG. 8 shows that in some embodiments, a power amplification system can include a common base amplifier implemented within a Doherty power amplifier.

FIG. 8 shows that in some embodiments, a power amplification system 800 can include a common base amplifier 850 implemented within a Doherty power amplifier.

The example power amplification system 800 is shown to include an input port (RF_IN) for receiving an input RF signal to be amplified. Such an input RF signal can be partially amplified by a pre-driver amplifier 802 before being divided into a carrier amplification path 810 and a peaking amplification path 830. Such a division can be achieved by a divider 804. In some implementations, the pre-driver amplifier 802 is a common base amplifier. In some implementations, the pre-driver amplifier 802 is absent.

In FIG. 8, the carrier amplification path 810 is shown to include an attenuator 812, a common base amplifier 850, and amplification stages collectively indicated as 814. The amplification stages 814 are shown to include a driver stage 816 and an output stage 820. The driver stage 816 is shown to be biased by a bias circuit 818, and the output stage 820 is shown to be biased by a bias circuit 822. In some embodiments, there may be more or fewer amplification stages. In various examples described herein, the amplification stages 814 are sometimes described as a carrier amplifier; however, it will be understood that such an amplifier can include one or more stages.

In FIG. 8, the peaking amplification path 830 is shown to include phase shifting circuit 832, the common base amplifier 850, and amplification stages collectively indicated as 834. The amplification stages 834 are shown to include a driver stage 836 and an output stage 840. The driver stage 836 is shown to be biased by a bias circuit 838, and the output stage 840 is shown to be biased by a bias circuit 842. In some embodiments, there may be more or fewer amplification stages. In various examples described herein, the amplification stages 834 are sometimes described as a peaking amplifier; however, it will be understood that such an amplifier can include one or more stages.

FIG. 8 further shows that the carrier amplification path 810 and the peaking amplification path 830 can be combined by a combiner 844 so as to yield an output RF signal (an amplified version of the input RF signal) at an output port (RF_OUT). Examples related to the combiner 844 (and Doherty power amplifiers in general) are described in U.S. patent application Ser. No. 14/824,856, filed Aug. 12, 2015, entitled DOHERTY POWER AMPLIFIER COMBINER WITH TUNABLE IMPEDANCE TERMINATION CIRCUIT, the disclosure of which is hereby expressly incorporated by reference herein in its entirety The common base amplifier 850 includes two common base amplifier components, each disposed along a respective path of the power amplification system 800. Each of the common base amplifier components is configured to receive a respective input RF signal (e.g., a carrier RF signal or a peaking RF signal) and amplify the respective input RF signal to generate a respective intermediate RF signal. Each of the amplifiers 814, 834 is configured to amplify the respective intermediate RF signal to generate a respective output RF signal. The two output RF signals are combined by the combiner 844 to generate the output RF signal at the output port.

The common base amplifier 850 includes a first transistor 851 disposed along the carrier path 810. The first transistor 851 has an emitter coupled to a carrier input node (the output of the attenuator 812), a base coupled to a battery voltage via a resistor 854, and an emitter coupled to the battery voltage via an inductor 858. The base of the first transistor 851 is further coupled to a ground potential via a first capacitor 853 and the emitter of the first transistor 851 is further coupled to a carrier intermediate node (the input of the carrier amplifier 814) via a second capacitor 857.

The common base amplifier 850 includes a second transistor 852 disposed along the peaking path 830. The second transistor 852 has an emitter coupled to a peaking input node (the output of the phase shifting circuit 832), a base coupled to the battery voltage via a resistor 856, and an emitter coupled to the battery voltage via an inductor 860. The base of the second transistor 852 is further coupled to the ground potential via a first capacitor 855 and the emitter of the second transistor 852 is further coupled to a peaking intermediate node (the input of the peaking amplifier 834) via a second capacitor 859.

The common base amplifier 850 includes two LC tank circuits (one for each path). The first LC tank circuit (which may be tuned to appear as an open circuit for a transmission frequency) includes an inductor 861 coupled between the emitter of the first transistor 851 and the ground potential and a capacitor 862 coupled between the emitter of the first transistor 851 and the ground potential. The second LC tank circuit (which may also be tuned to appear as an open circuit for the transmission frequency) includes an inductor 863 coupled between the emitter of the second transistor 852 and the ground potential and a capacitor 864 coupled between the emitter of the second transistor 852 and the ground potential.

A Doherty power amplifier can suffer from up to a 3 dB reduction in gain as compared to a single-ended power amplifier due to insertion loss of the divider 804. Due to the high inter-stage impedance of the carrier amplifier 814 and the peaking amplifier 834, the common base amplifier 850 can easily provide between approximately 3 and 5 dB of gain. Further, the collector voltage to the transistors 851, 852 of the common base amplifier 850 can be supplied directly from a battery to avoid a negative impact on the overall power added efficiency (PAE).

Figure 9:
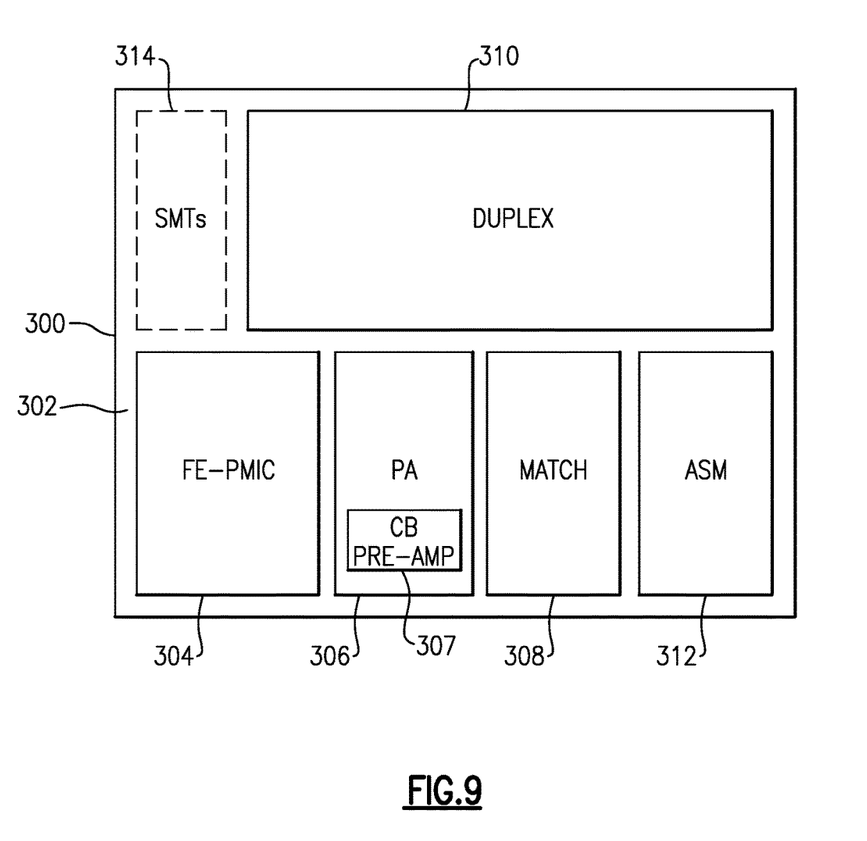
FIG. 9 depicts a module having one or more features as described herein.

FIG. 9 shows that in some embodiments, some or all of power amplification systems (e.g., those shown in FIGS. 5-8) can be implemented, wholly or partially, in a module. Such a module can be, for example, a front-end module (FEM). In the example of FIG. 9, a module 300 can include a packaging substrate 302, and a number of components can be mounted on such a packaging substrate. For example, an FE-PMIC component 304, a power amplifier assembly 306, a match component 308, and a duplexer assembly 310 can be mounted and/or implemented on and/or within the packaging substrate 302. The power amplifier assembly 306 may include a common base pre-amplifier 307 such as those described above with respect to FIGS. 5-8. Other components such as a number of SMT devices 314 and an antenna switch module (ASM) 312 can also be mounted on the packaging substrate 302. Although all of the various components are depicted as being laid out on the packaging substrate 302, it will be understood that some component(s) can be implemented over other component(s).

In some implementations, a device and/or a circuit having one or more features described herein can be included in an RF device such as a wireless device. Such a device and/or a circuit can be implemented directly in the wireless device, in a modular form as described herein, or in some combination thereof. In some embodiments, such a wireless device can include, for example, a cellular phone, a smart-phone, a hand-held wireless device with or without phone functionality, a wireless tablet, etc.

Figure 10:
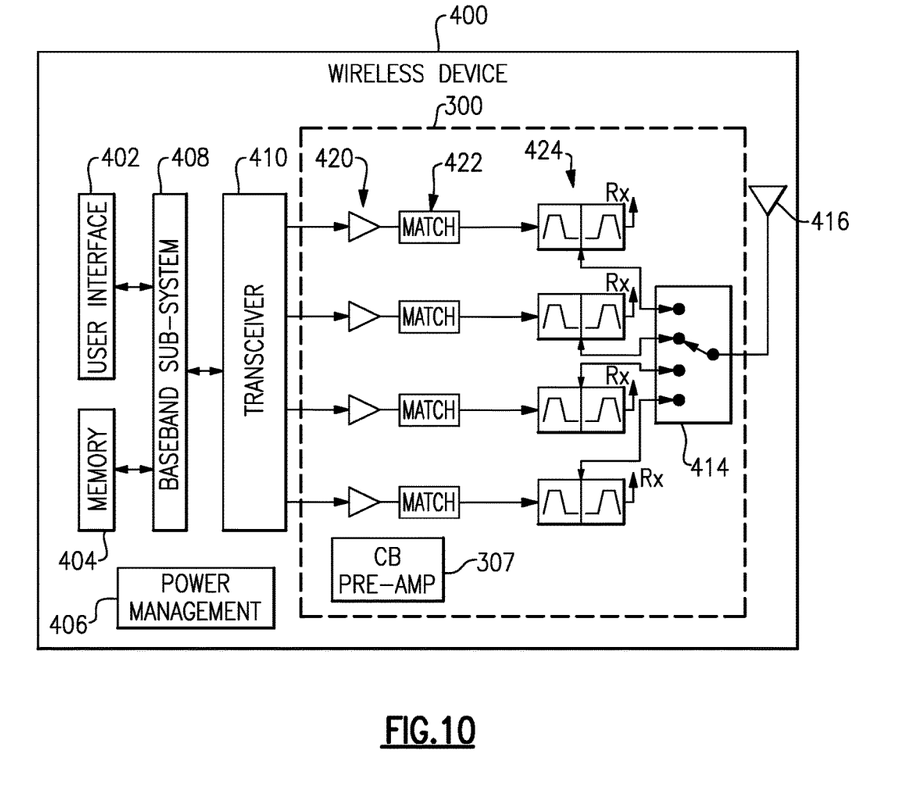
FIG. 10 depicts a wireless device having one or more features described herein.

FIG. 10 depicts an example wireless device 400 having one or more advantageous features described herein. In the context of a module having one or more features as described herein, such a module can be generally depicted by a dashed box 300, and can be implemented as, for example, a front-end module (FEM).

Referring to FIG. 10, power amplifiers (PAs) 420 can receive their respective RF signals from a transceiver 410 that can be configured and operated in known manners to generate RF signals to be amplified and transmitted, and to process received signals. The transceiver 410 is shown to interact with a baseband sub-system 408 that is configured to provide conversion between data and/or voice signals suitable for a user and RF signals suitable for the transceiver 410. The transceiver 410 can also be in communication with a power management component 406 that is configured to manage power for the operation of the wireless device 400. Such power management can also control operations of the baseband sub-system 408 and the module 300.

The baseband sub-system 408 is shown to be connected to a user interface 402 to facilitate various input and output of voice and/or data provided to and received from the user. The baseband sub-system 408 can also be connected to a memory 404 that is configured to store data and/or instructions to facilitate the operation of the wireless device, and/or to provide storage of information for the user.

In the example wireless device 400, outputs of the PAs 420 are shown to be matched (via respective match circuits 422) and routed to their respective duplexers 424. Such amplified and filtered signals can be routed to an antenna 416 through an antenna switch 414 for transmission. In some embodiments, the duplexers 424 can allow transmit and receive operations to be performed simultaneously using a common antenna (e.g., 416). In FIG. 16, received signals are shown to be routed to "Rx" paths (not shown) that can include, for example, a low-noise amplifier (LNA).

A number of other wireless device configurations can utilize one or more features described herein. For example, a wireless device does not need to be a multi-band device. In another example, a wireless device can include additional antennas such as diversity antenna, and additional connectivity features such as Wi-Fi, Bluetooth, and GPS.

As described herein, one or more features of the present disclosure can provide a number of advantages when implemented in systems such as those involving the wireless device of FIG. 10. For example, the disclosed architecture may require a small amount of space on a die, provide natural input impedance matching of 50 ohms over a broad range of frequencies without a separate input matching circuit, provide moderate gain for improved stability, and improve AM-AM linearization of the power amplification system.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Description using the singular or plural number may also include the plural or singular number respectively. The word "or" in reference to a list of two or more items, that word covers all of the following interpretations of the word: any of the items in the list, all of the items in the list, and any combination of the items in the list.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While some embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A power amplification system comprising:
a common base amplifier including a transistor having an emitter, a collector, and a base, and configured to amplify an input signal received at an input node coupled to the emitter to generate an intermediate signal at an intermediate node coupled to the collector, the base coupled to a ground potential;
an LC tank circuit including an inductor coupled between the emitter and the ground potential and a capacitor coupled between the emitter and the ground potential; and
a power amplifier configured to amplify the intermediate signal received at the intermediate node to generate an output signal at an output node.

2. The power amplification system of claim 1 wherein the collector is coupled to the intermediate node via an impedance.

3. The power amplification system of claim 2 wherein the impedance includes a capacitor coupled between the collector and the intermediate node and an inductor coupled between the collector and a supply voltage.

4. A power amplification system comprising:
a common base amplifier including a transistor having an emitter, a collector, and a base, and configured to amplify an input signal received at an input node coupled to the emitter to generate an intermediate signal at an intermediate node coupled to the collector, the base coupled to a ground potential via an impedance that includes a capacitor, the base further coupled to a battery voltage via a resistor; and
a power amplifier configured to amplify the intermediate signal received at the intermediate node to generate an output signal at an output node.

5. The power amplification system of claim 1 wherein the common base amplifier is configured to amplify the input signal by approximately 3 to 5 dB.

6. The power amplification system of claim 1 wherein the common base amplifier presents an input impedance of approximately 50 ohms.

7. The power amplification system of claim 1 wherein the power amplifier is a single-ended power amplifier.

8. The power amplification system of claim 7 wherein the single-ended power amplifier includes a cascode power amplifier.

9. The power amplification system of claim 1 wherein the power amplifier is one of a carrier amplifier or a peaking amplifier of a Doherty power amplifier.

10. A power amplification system comprising:
a common base amplifier including a transistor having an emitter, a collector, and a base, and configured to amplify an input signal received at an input node coupled to the emitter to generate an intermediate signal at an intermediate node coupled to the collector, the base coupled to a battery voltage via a resistor, the collector coupled to the battery node via an inductor; and
a power amplifier configured to amplify the intermediate signal received at the intermediate node to generate an output signal at an output node.

11. The power amplification system of claim 10 wherein the base is further coupled to a ground potential via a first capacitor and the collector is further coupled to the intermediate node via a second capacitor.

12. The power amplification system of claim 1 wherein the power amplifier is a high-voltage power amplifier.

13. The power amplification system of claim 12 wherein the high-voltage power amplifier is a high-voltage bipolar transistor power amplifier.

14. A radio-frequency module comprising:
a packaging substrate configured to receive a plurality of components; and
a power amplification system implemented on the packaging substrate, and including a common base amplifier configured to amplify an input signal received at an input node to generate an intermediate signal at an intermediate node, the common base amplifier including a transistor having an emitter coupled to the input node, a collector coupled to the intermediate node, and a base coupled to a ground potential, the power amplification system further including an LC tank circuit having an inductor coupled between the emitter and the ground potential and a capacitor coupled between the emitter and the ground potential, the power amplification system further including a power amplifier configured to amplify the intermediate signal received at the intermediate node to generate an output signal at an output node.

15. The radio-frequency module of claim 14 wherein the radio-frequency module is a front-end module.

16. A wireless device comprising:
a transceiver configured to generate an input signal;
a front-end module in communication with the transceiver, and including a power amplification system that includes a common base amplifier configured to amplify at least a portion of the input signal received at an input node to generate an intermediate signal at an intermediate node, the common base amplifier including a transistor having an emitter coupled to the input node, a collector coupled to the intermediate node, and a base coupled to a ground potential, the power amplification system further including an LC tank circuit having an inductor coupled between the emitter and the ground potential and a capacitor coupled between the emitter and the ground potential, the power amplification system further including a power amplifier configured to amplify the intermediate signal received at the intermediate node to generate an output signal at an output node; and
an antenna in communication with the front-end module, and configured to transmit the output signal.

17. The wireless device of claim 16 wherein the portion of the input signal is at least one of a carrier portion or a peaking portion.

* * * * *